United States Patent
Hosokawa et al.

[11] Patent Number: 6,007,652
[45] Date of Patent: Dec. 28, 1999

[54] METHOD OF PREPARING METAL THIN FILM HAVING EXCELLENT TRANSFERABILITY

[75] Inventors: Takao Hosokawa; Yoshiaki Kohno, both of Kyoto, Japan

[73] Assignee: Murata Manufacturing Co., Ltd., Kyoto, Japan

[21] Appl. No.: 08/026,208

[22] Filed: Mar. 2, 1993

Related U.S. Application Data

[63] Continuation of application No. 07/786,273, Nov. 1, 1991, abandoned.

[30] Foreign Application Priority Data

Nov. 5, 1990 [JP] Japan ..................................... 2-300347
Jun. 17, 1991 [JP] Japan ..................................... 3-144591

[51] Int. Cl.$^6$ ............................................................. H05K 3/20
[52] U.S. Cl. ........................................ 156/89.16; 156/233
[58] Field of Search .................................... 428/606, 607, 428/935, 936, 636, 938; 156/233, 234, 89, 541, 89.16, 89.17, 89.18, 89.19, 89.21

[56] References Cited

U.S. PATENT DOCUMENTS

| | | | |
|---|---|---|---|
| 2,724,674 | 11/1955 | Pritikim | 156/89 |
| 3,192,086 | 6/1965 | Gyurk | 156/89 |
| 3,284,683 | 11/1966 | Rieth | 156/89 |
| 3,615,980 | 10/1971 | Schrck | 156/89 |
| 3,655,496 | 4/1972 | Ettre et al. | 156/89 |
| 3,904,488 | 9/1975 | Nosker et al. | 204/38.4 |
| 4,193,849 | 3/1980 | Sato | 204/38.4 |
| 4,568,413 | 2/1986 | Toth et al. | 204/38.4 |
| 4,622,106 | 11/1986 | Kitagawa | 204/38.4 |
| 4,748,086 | 5/1986 | Akoh | 204/38.4 |
| 4,753,694 | 6/1988 | Herron et al. | 156/231 |
| 4,814,047 | 3/1989 | Redlich et al. | 204/38.4 |
| 4,825,539 | 5/1989 | Magashima et al. | 159/89 |
| 4,832,799 | 8/1989 | Knudsen et al. | 204/38.4 |
| 4,863,808 | 9/1989 | Sallo | 428/635 |
| 5,009,744 | 4/1991 | Mundai et al. | 156/656 |
| 5,015,338 | 5/1991 | Tabuchi et al. | 204/38.4 |

FOREIGN PATENT DOCUMENTS

| | | |
|---|---|---|
| 0381879 | 8/1990 | European Pat. Off. |
| 2-084794 | 3/1990 | Japan . |
| 2-141533 | 5/1990 | Japan . |
| 2082632 | 3/1982 | United Kingdom . |

*Primary Examiner*—John J. Zimmerman
*Attorney, Agent, or Firm*—Ostrolenk, Faber, Gerb & Soffen, LLP

[57] ABSTRACT

A metal thin film having excellent transferability onto a ceramic sheet is provided in order to facilitate formation of an internal electrode for a multilayer ceramic capacitor, for example, by a technique of transferring a metal thin film. A first metal layer (2) of nickel or copper or another metal is formed on a film (1) by vapor deposition, and then a second metal layer (3) of nickel or copper or another metal is formed on the first metal layer (2) by wet plating such as electroplating or electroless plating, thereby providing a metal thin film constituted by the first and second metal layers (2 and 3) having excellent transferability.

6 Claims, 1 Drawing Sheet

METHOD OF PREPARING METAL THIN FILM HAVING EXCELLENT TRANSFERABILITY

This is a continuation of application Ser. No. 07/786,273 filed on Nov. 1, 1991, now abandoned.

BACKGROUND OF THE INVENTION

1. Field of the Invention

The present invention relates to a metal thin film which has excellent transferability, and a method of preparing the same.

A metal thin film obtained according to the present invention is transferrable so that it may be used in a circuit which is provided on a substrate, an electrode for an electronic component, a display metallic foil or the like, for example.

2. Description of the Background Art

Japanese Patent Laying-Open No. 1-42809 (1989), now U.S. Pat. No. 5,009,744, discloses a transfer technique which is employed for forming electrodes for an electronic component, and more specifically, internal electrodes for a multilayer ceramic capacitor, for example. Such a transfer technique is evaluated as a technique which is effective for forming thin internal electrodes.

In more detail, a thin film forming method such as vapor deposition or sputtering is known as a method of forming thin internal electrodes, i.e., metal thin films. A plurality of unfired ceramic green sheets are laminated in order to prepare a multilayer ceramic capacitor. The internal electrodes, which are provided between adjacent ones of the ceramic green sheets, must be formed in advance of lamination. However, it is difficult to directly form metal thin films on the ceramic green sheets, which are mechanically weak and hard to handle, by the aforementioned thin film forming method. First, therefore, thin films for defining internal electrodes are formed on handleable films which are different from ceramic green sheets, and then transferred onto ceramic green sheets, so that it is easy or possible to form the metal thin films on the ceramic green sheets.

Thus, the internal electrodes are formed by metal thin films through a transfer technique, so that it is possible to reduce the dimensions, particularly the thickness, of the as-formed multilayer ceramic capacitor. In addition, it is possible to ever out the thickness in the laminated state along the direction of extension of the ceramic green sheets. Due to the latter property, it is possible to reduce the possibility of inconveniences such as delamination after firing of the laminated ceramic green sheets.

Thus, the transfer technique enables formation of internal electrodes of metal thin films which provide some advantages in relation to a multilayer ceramic capacitor. It is desirable for each metal thin film to be completely transferred onto a target surface with excellent transferability, in order to carry out the transfer technique. If the metal thin film is not completely transferred with a desired pattern by the transfer technique which is employed for forming an internal electrode for a multilayer ceramic capacitor, for example, the as-formed multilayer ceramic capacitor is rendered defective, as a matter of course.

SUMMARY OF THE INVENTION

Accordingly, an object of the present invention is to provide a metal thin film having excellent transferability and a method of preparing the same.

The metal thin film according to the present invention is provided with at least two layers, including a first metal layer which is formed on a film and a second metal layer which is formed above the first metal layer. The first metal layer is formed by vapor deposition, while the second metal layer is formed by wet plating such as electroplating or electroless plating.

Metals for forming the first and second metal layers may be different from or identical to each other.

The first metal layer is formed of nickel, copper or silver, for example. The second metal layer is formed of nickel, copper or palladium, for example.

The film employed for forming the metal layers must have flexibility and heat resistance, as well as sufficient resistance against vapor deposition, wet plating and patterning with photolithography or the like. Such a film is prepared from a resin film of polyethylene terephthalate etc., or a metallic foil of nickel, copper, aluminum or the like.

The metal thin film according to the present invention is prepared with excellent transferability, to be transferred onto a target of a ceramic green sheet, a ceramic material, a resin material, a metal or the like. As to transfer conditions, the metal thin film is first brought into contact with the target, and then transferred thereto under a pressure of 10 to 500 kg/cm$^2$ at a temperature of 60 to 95° C., for example, by so-called hot stamping.

The present invention is based on the recognition by the inventors that a metal thin film which is formed on a film by vapor deposition generally has relatively low adhesion with respect to the film, i.e., excellent transferability.

However, the ease of vapor deposition for forming a metal thin film depends on the type of metal. Further, the transferability of a metal thin film which is formed by vapor deposition also depends on the type of metal. In order to attain the object of the present invention, therefore, it is necessary to prepare a material for the thin film, which is formed on a film by vapor deposition, from a metal which is excellent in transferability and easy to deposit. However, a metal selected in consideration of ease of vapor deposition and transferability is not necessarily suitable as an electrode material for a target electronic component or the like. When a metal layer is formed only by vapor deposition along its overall thickness, further, a peel surface of the film is thermally denatured in the vapor deposition process, so as to require high peel strength or cause difficulty in peeling. Further, the film is warped by residual stress of the metal layer which is obtained by vapor deposition. In addition, a long time is required for forming the metal layer due to a low vapor deposition rate, leading to increase in manufacturing cost. According to the present invention, therefore, the first metal layer is formed of a metal which is selected in consideration of ease of in vapor deposition and transferability, while the second metal layer is formed above the first metal layer to compensate for properties which are insufficient in the metal forming the first metal layer. The second metal layer can be formed of an optimum metal which is selected in consideration of properties required for an electrode for a target electronic component or the like, since it is not necessary to consider ease of vapor deposition and transferability. Further, the second metal layer also compensates for the thickness of the first metal layer which is formed by vapor deposition in addition to compensation for insufficient properties of the first metal layer, so as to easily attain a thickness required for the overall metal thin film to be transferred. Therefore, the first and second metal layers may be formed of either different or identical metals.

According to the present invention, further, the second metal layer is formed by wet plating such as electroplating or electroless plating. When the second metal layer is formed above the first metal layer by wet plating, adhesion of the first metal layer with respect to the film is not increased, unlike when the entire thickness of a metal layer is formed only by vapor deposition.

Thus, according to the present invention, the metal thin film is provided with at least two layers including first and second metal layers, so that the first metal layer is adapted to provide transferability while the second metal layer is adapted to provide properties which are required for an electrode for a target electronic component or the like. Therefore, it is easy to satisfy both transferability and other desired properties over the entire metal thin film. For example, a metal thin film having excellent transferability can be formed by a metal, which has not been suitable for transfer in general, to widen the range of metals that can be used in a transfer process, and it is also possible to widen the range of applicability of the transferable metal thin film.

Since it is easy to pattern a metal thin film which is formed on a film by photoetching, for example, a metal thin film according to the present invention can be advantageously used in an electrode for an electronic component, an internal or external conductor for a multilayer substrate, a conductor which is provided on a circuit board, a display metallic foil, or the like.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The following Experimental Examples were made according to the present invention:

Experimental Example 1

Experimental Example 1 was adapted to prepare a transfer metallic foil.

Figure 1:
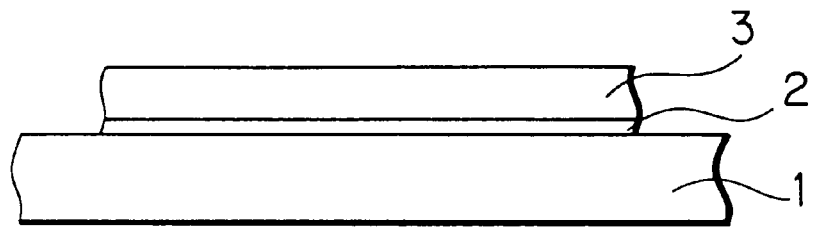
FIG. 1 is a sectional view showing an embodiment of the present invention.

A film 1 was first prepared as shown in FIG. 1. This film 1 was prepared from polyethylene terephthalate, which is not deformed even under a temperature of about 100° C., and coated with silicon in order to further improve transferability of a metal thin film to be formed.

Then, a nickel deposition film 2 was formed on the film 1, as shown in FIG. 1. This nickel deposition film 2 was formed by electron beam heating with an acceleration voltage of 10 kV under an atmospheric pressure of not more than $5 \times 10^{-4}$ Torr. The as-formed nickel deposition film 2 was 0.1 $\mu$m in thickness (comparative sample 1).

Then, a nickel plating film 3 was formed on another nickel deposition film 2 by electroplating, as shown in FIG. 1. The electroplating step was carried out with a current density of 1 A/cm$^2$ in a plating bath of sulfonamino acid, while setting the nickel deposition film 2 and a nickel plate on minus and plus sides respectively. Such plating was performed for 3 minutes, to obtain the nickel plating film 3 of 1 $\mu$m in thickness (inventive sample 1).

Then, a nickel plating film 3 was formed on still another nickel deposition film 2 by electroless plating, in place of the aforementioned electroplating, as shown in FIG. 1. The electroless plating step was carried out in an alkaline hydrazine bath at a liquid temperature of 80° C. Such plating was performed for 4 minutes, to obtain the nickel plating film 3 of 1 $\mu$m in thickness (inventive sample 2).

The aforementioned comparative sample 1 and the inventive samples 1 and 2 were subjected to evaluation of transferability onto paper and plastic surfaces. First, the surfaces of the metal thin films, i.e., those of the nickel deposition film 2 in the comparative sample 1 and the nickel plating films 3 in the inventive samples 1 and 2, were coated with adhesive agents. Then, the metal thin films were transferred to the paper and plastic surfaces by hot stamping, with application of a pressure of 100 kg/cm$^2$ for 10 seconds.

According to the comparative sample 1, the metal thin film, i.e., the nickel deposition film 2, was transferred onto the paper and plastic surfaces when the hot stamping temperature was 100° C. In the inventive samples 1 and 2, on the other hand, it was possible to transfer the metal thin films, i.e., the nickel deposition films 2 and the nickel plating films 3, onto the paper and plastic surfaces at a temperature of 80° C.

In the aforementioned Experimental Example 1, similar results were obtained also when gold, silver and copper were employed in place of nickel. Further, similar results were obtained also when at least two layers were prepared from such metals.

Experimental Example 2

Figure 2:
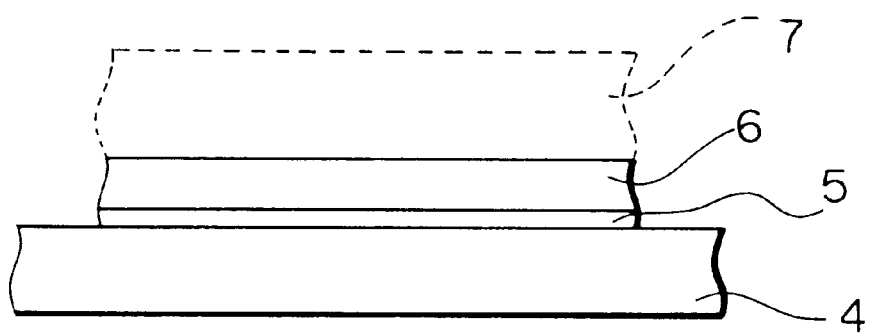
FIG. 2 is a sectional view showing another embodiment of the present invention.

As shown in FIG. 2, a film 4 was first prepared from the same material as the film 1 employed in Experimental Example 1.

Then, a copper deposition film 5 of 0.1 $\mu$m in thickness was formed on the film 4 by vapor deposition under the same conditions as Experimental Example 1 (comparative sample 2).

Then, a nickel plating film 6 of 1 $\mu$m in thickness was formed on another copper deposition film 5 by electroplating under the same conditions as Experimental Example 1 (inventive sample 3).

On the other hand, a nickel plating film 6 of 1 $\mu$m in thickness was formed on still another copper deposition film 5 by electroless plating, in place of the aforementioned electroplating, under the same conditions as Experimental Example 1 (inventive sample 4).

In order to evaluate transferability of the comparative sample 2 and the inventive samples 3 and 4, the following experiment was performed:

Slurry was prepared from a nonreducing dielectric ceramic material which was mainly composed of barium titanate. The surfaces of the metal films, i.e., those of the copper deposition film 5 in the comparative sample 2 and the nickel plating films 6 in the inventive samples 3 and 4, were coated with this slurry and dried to form ceramic green sheets 7, which were then peeled off the film 4. In the comparative sample 2, the copper deposition film 5 was not in the least separated from the film 4, although the ceramic green sheet 7 was peeled off. In the inventive samples 3 and 4, on the other hand, the copper deposition films 5 and the nickel plating films 6 were separated from the films 4 upon peeling off the ceramic green sheets 7.

Multilayer ceramic capacitors using the inventive samples 3 and 4 were formed as follows. The nickel plating films 6 of the inventive samples 3 and 4 were coated with photoresist films, and thereafter the metal thin films, i.e., the copper deposition films 5 and the nickel plating films 6, were patterned to form internal electrodes for multilayer ceramic capacitors by photoetching.

Then, ceramic green sheets 7 of 10 to 15 μm in thickness were formed on the surfaces of the films 4, which were provided with the metal thin films, by a doctor blade coater. The ceramic green sheets 7 were formed of the aforementioned slurry of a nonreducing dielectric ceramic material.

Then, a plurality of such ceramic green sheets 7 were stacked with thermocompression bonding being applied to bond every adjacent pair of stacked ceramic green sheets, and the films 4 were peeled after every thermocompression bonding. In this case, the metal thin films were completely separated from the films 4.

Each of the as-formed laminates were cut in dimensions for defining a single multilayer ceramic capacitor, fired and provided with external electrodes, thereby forming a multilayer ceramic capacitor.

The as-formed multilayer ceramic capacitor was smaller in thickness as compared with a conventional typical multilayer ceramic capacitor whose internal electrodes were formed by screen printing of metal paste, and further, its thickness was homogeneous along the direction of extension of the ceramic sheets. In addition, no deterioration of electric characteristics, such as reduction of capacitance, was observed since the internal electrodes exhibited no defects such as pores.

Experimental Example 3

A film 1 was prepared in a similar manner to Experimental Example 1.

Then, a copper deposition film 2 of 1 μm in thickness was formed on the film 1 by vapor deposition as shown in FIG. 1, under the same conditions as Experimental Example 1 (comparative sample 3).

On the other hand, a copper deposition film 2 of 0.1 μm in thickness was formed on another film 1 by vapor deposition as shown in FIG. 1, and a copper plating film 3 of 1 μm in thickness was formed on the copper deposition film 2 by electroplating under the same conditions as Experimental Example 1 (inventive sample 5).

Then, a copper plating film 3 of 1 μm in thickness was formed on still another copper deposition film 2 by electroless plating in place of the aforementioned electroplating, under the same conditions as Experimental Example 1 (inventive sample 6).

In order to evaluate transferability of the comparative sample 3 and the inventive samples 5 and 6, the following experiment was performed:

A pair of 2 cm-square plates were prepared to hold each of the comparative sample 3 and the inventive samples 5 and 6, and contact surfaces therebetween were fixed to each other with an adhesive agent. In this case, the plates were outwardly pulled to examine strength required for peeling the copper deposition film 2 from the film 1. The comparative sample 3 required peel strength of 3000 g, while the inventive samples 5 and 6 required 2000 g respectively.

Further, it was difficult to pattern the comparative sample 3 by photoetching, since the film 1 was extremely warped and it was difficult to obtain a flat surface.

Experimental Example 4

A film 1 was prepared in a similar manner to Experimental Example 1.

Then, a nickel deposition film 2 of 1 μm in thickness was formed on the film 1 by vapor deposition as shown in FIG. 1, under the same conditions as Experimental Example 1 (comparative sample 4).

On the other hand, a nickel deposition film 2 of 0.1 μm in thickness was formed on another film 1 by vapor deposition as shown in FIG. 1, and a nickel plating film of 1 μm in thickness was formed on the nickel deposition film 2 by electroplating under the same conditions as Experimental Example 1 (inventive sample 7).

Then, a nickel plating film 3 of 1 μm in thickness was formed on still another nickel deposition film 2 by electroless plating, in place of the aforementioned electroplating, under the same conditions as Experimental Example 1 (inventive sample 8).

The comparative sample 4 and the inventive samples 7 and 8 were subjected to evaluation of transferability similarly to Experimental Example 1. In the comparative sample 4, it was impossible to transfer the metal thin film even if hot stamping was performed at a temperature of 100° C. Further, it was difficult to pattern the comparative sample 4 by photoetching since the nickel deposition film 2 was extremely cracked and the film 1 was so warped that it was difficult to obtain a flat surface. In the inventive samples 7 and 8, on the other hand, it was possible to transfer the metal thin films, i.e., the nickel deposition films 2 and the nickel plating films 3, onto paper and plastic surfaces at a temperature of 80° C.

While the present invention has been described in relation to Experimental Examples 1 to 4, the first and second metal layers may be prepared from arbitrary metals.

The second metal layer may not necessarily be brought into contact with the first metal layer. For example, at least a single third metal layer may be provided between the first and second metal layers. In this case, the third metal layer may be formed by a method such as sputtering, electroplating, electroless plating or the like.

The film for forming the first metal layer, which is prepared from resin, for example, may not inevitably be subjected to treatment for improving transferability, such as the aforementioned silicon coating. When the film itself is formed of a material which essentially has small adhesion with respect to a metal, it is not necessary to perform surface treatment for improving transferability.

In addition to the aforementioned Examples, it is possible to form the following substance by properly selecting materials for the first and second metal layers:

A first metal layer which is prepared from copper and a second metal layer which is prepared from nickel are transferred onto a ceramic green sheet for a semiconducting ceramic capacitor. A plurality of such ceramic green sheets are laminated and then fired so that the same are vitrified. Thereafter re-oxidation treatment is performed to diffuse copper in the ceramic material and convert grain boundaries of the semiconducting ceramic into insulator states, thereby obtaining an intergranular-insulated multilayer ceramic capacitor.

Alternatively, a first metal layer of aluminum, a second metal layer of copper and a third metal layer of aluminum may be transferred onto a ceramic green sheet. A plurality of such ceramic green sheets are laminated and then fired, so that the aluminum layers are converted to $Al_2O_3$ layers, thereby preventing diffusion of copper. Such a technique is used in preparation of a multilayer ceramic capacitor so as to prevent diffusion of copper in the ceramic layers, during the process of forming copper internal electrodes. Thus, it is possible to prepare a multilayer ceramic capacitor which has small dispersion of characteristics, particularly capacitance.

In this case, the second metal layer may be formed of nickel in place of copper, to attain a similar effect.

The present invention is advantageously applicable to forming electrodes for an electronic component, more specifically, internal electrodes for a multilayer ceramic capacitor. For example, first, a capacitor can be obtained by the steps of transferring metal thin films onto ceramic sheets, and stacking the ceramic sheets. Secondly, a capacitor can be obtained by the steps of transferring metal thin films onto a ceramic block of a plurality of stacked ceramic sheets, further stacking a ceramic sheet on the ceramic block, transferring metal thin films onto the ceramic sheet, and repeating the last two steps. Thirdly, a capacitor can be obtained by the steps of forming a metal thin film on a film, forming a ceramic sheet on the surface of the film, which is provided with the metal thin film, peeling the ceramic sheet together with the metal thin film from the film, and stacking such peeled ceramic sheets. Fourthly, a capacitor can be obtained by the steps of forming a metal thin film on a film, forming a first ceramic sheet on the surface of the film, which is provided with the metal thin film, stacking the first ceramic sheet on a second ceramic sheet, and peeling the film from the first ceramic sheet.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of manufacturing a ceramic electronic component, comprising ceramic green sheets, and an electrode formed on at least one of said ceramic green sheets, said method comprising the steps of:

(a) forming a first metal layer on a film by vapor deposition;

(b) forming a second metal layer above said first metal layer by wet plating;

(c) patterning said metal layers;

(d) applying a ceramic slurry to said patterned metal layers which are present on said film to form a ceramic green sheet;

(e) laminating said ceramic green sheet obtained by step (d) on a second ceramic green sheet with said first-mentioned ceramic green sheet facing said second ceramic green sheet;

(f) peeling said film off said first ceramic green sheet and said metal layers after said laminating step (e);

(g) repeating steps (e) and (f); and (h) firing said ceramic green sheets so as to form said ceramic electronic component.

2. A method as in claim 1, wherein said wet plating is electroplating.

3. A method as in claim 1, wherein said wet plating is electroless plating.

4. A method as in claim 1, wherein said first and second metal layers are formed of different metals.

5. A method as in claim 1, wherein said first and second metal layers are formed of the same metal.

6. A method of manufacturing a ceramic electronic component, comprising ceramic green sheets, and an electrode formed on at least one of said ceramic green sheets, said method comprising the steps of:

(a) forming a metal layer on a film;

(b) patterning said metal layer;

(c) applying a ceramic slurry to said patterned metal layer which is present on said film to form a ceramic green sheet;

(d) laminating said ceramic green sheet obtained by step (c) on a second ceramic green sheet with said first-mentioned ceramic green sheet facing said second ceramic green sheet;

(e) peeling said film off said first ceramic green sheet and said metal layer after said laminating step (d);

(f) repeating steps (d) and (e); and (g) firing said ceramic green sheets so as to form said ceramic electronic component.

* * * * *